(12) United States Patent
Madden et al.

(10) Patent No.: US 10,783,030 B2
(45) Date of Patent: Sep. 22, 2020

(54) NETWORK SYNCHRONIZATION FOR MASTER AND SLAVE DEVICES

(71) Applicant: Sensia LLC, Houston, TX (US)

(72) Inventors: Thomas M. Madden, Duncan, OK (US); Robert Diederichs, Edmonton (CA); Jerry Yee, Edmonton (CA)

(73) Assignee: Sensia LLC, Houston, TX (US)

( * ) Notice: Subject to any disclaimer, the term of this patent is extended or adjusted under 35 U.S.C. 154(b) by 0 days.

(21) Appl. No.: 14/207,265

(22) Filed: Mar. 12, 2014

(65) Prior Publication Data

US 2015/0261601 A1 Sep. 17, 2015

(51) Int. Cl.
| | |
|---|---|
| *G06F 11/00* | (2006.01) |
| *G06F 11/10* | (2006.01) |
| *G05B 19/00* | (2006.01) |
| *G05B 19/418* | (2006.01) |
| *G05B 19/042* | (2006.01) |
| *H03M 13/09* | (2006.01) |

(52) U.S. Cl.
CPC .......... *G06F 11/1004* (2013.01); *G05B 19/00* (2013.01); *G05B 19/0425* (2013.01); *G05B 19/4186* (2013.01); *G05B 2219/24028* (2013.01); *G05B 2219/25068* (2013.01); *G05B 2219/25153* (2013.01); *G05B 2219/25157* (2013.01); *H03M 13/09* (2013.01); *Y02P 90/185* (2015.11)

(58) Field of Classification Search
CPC .... G06F 11/104; G06F 11/1004; G06F 11/10; G11B 2020/1843; H04L 1/0061; H04L 1/0057; H03M 13/09

USPC .......... 714/758, 807, 775, 798, 819
See application file for complete search history.

(56) References Cited

U.S. PATENT DOCUMENTS

| | | | | | |
|---|---|---|---|---|---|
| 5,968,149 | A | * | 10/1999 | Jaquette | G06F 11/1616 710/1 |
| 6,467,060 | B1 | * | 10/2002 | Malakapalli | G11B 20/18 714/758 |
| 6,967,589 | B1 | * | 11/2005 | Peters | E21B 47/00 166/250.15 |
| 7,039,656 | B1 | * | 5/2006 | Tsai | G06F 21/31 |

(Continued)

FOREIGN PATENT DOCUMENTS

| | | |
|---|---|---|
| EP | 2088706 A2 | 8/2009 |
| JP | 2003533809 A | 11/2003 |

(Continued)

OTHER PUBLICATIONS

International Search Report and Written Opinion Issued in Corresponding PCT Application No. PCT/US2015/019846, dated Jun. 18, 2015 (15 Pages).

(Continued)

*Primary Examiner* — Albert Decady
*Assistant Examiner* — Osman M Alshack
(74) *Attorney, Agent, or Firm* — Foley & Lardner LLP (57) ABSTRACT

An apparatus, system, and method to manage communications within a network, such as a wireless network and/or at least partially included within a hazardous area, includes creating a master CRC array from master configuration structures, creating a main master CRC value from the master CRC array, receiving a main slave CRC value, and determining if the main master CRC value and the main slave CRC value are different.

19 Claims, 4 Drawing Sheets

(56) References Cited

U.S. PATENT DOCUMENTS

| | | |
|---|---|---|
| 7,747,283 B2 | 6/2010 | Ho et al. |
| 2004/0138786 A1 | 7/2004 | Blackett et al. |
| 2004/0158333 A1* | 8/2004 | Ha .................. H04B 3/542 700/3 |
| 2008/0126909 A1* | 5/2008 | Talbot ............ G06F 11/1076 714/758 |
| 2008/0183928 A1* | 7/2008 | Devila ............ G06F 13/4291 710/110 |
| 2008/0250297 A1 | 10/2008 | Chung et al. |
| 2009/0007650 A1* | 1/2009 | Hayworth ............ E21B 43/26 73/152.29 |
| 2009/0106461 A1* | 4/2009 | Terayama .............. G06F 1/12 710/19 |
| 2011/0219280 A1* | 9/2011 | Blumrich ............ H03M 13/09 714/748 |
| 2012/0117443 A1* | 5/2012 | Lee .................. H03M 13/09 714/758 |
| 2012/0226965 A1* | 9/2012 | Hammerschmidt ........................ H03M 13/093 714/807 |
| 2013/0300577 A1 | 11/2013 | Cumeralto et al. |
| 2015/0106682 A1* | 4/2015 | Grocutt ............... G06F 11/1004 714/807 |

FOREIGN PATENT DOCUMENTS

| | | |
|---|---|---|
| JP | 2004533771 A | 11/2004 |
| JP | 2006209565 A | 8/2006 |

OTHER PUBLICATIONS

Toshihiro Katashita et al., A Scalable Light-weight Circuit for CRC Calculation, IPSJ Journal, Jul. 15, 2007, vol. 48 No. 7, p. 2382-2392.

* cited by examiner

NETWORK SYNCHRONIZATION FOR MASTER AND SLAVE DEVICES

BACKGROUND

Different protection techniques may be used to ensure the safe operation of electrical instruments in hazardous areas. A hazardous area is generally one where flammable gases and/or particles are present, or could be present. Two common protection methods to prevent the accidental ignition of flammable gases or particles include using electrical equipment that is rated as explosion proof and/or intrinsically safe. Explosion proof refers to equipment that is designed to contain an internal explosion resulting from the flammable gases and particulate entering the electronics. This ability to contain an internal explosion prevents subsequent ignition of the surrounding atmosphere. Intrinsic safety requirements are intended to guarantee that instrument operation or failure cannot cause ignition, such as if the instrument is properly installed in an environment that contains explosive gases. This is accomplished by limiting the maximum energy stored in the device in a worst case failure situation. Excessive energy discharge may lead to sparking or excessive heat, which could ignite an explosive environment in which the transmitter may be operating.

Such techniques and tools are highly useful in the process control and measurement industry to allow operators to conveniently communicate with and/or interrogate field devices in a given process installation. Examples of such process installations include petroleum, pharmaceutical, chemical, pulp, and other processing installations. In such installations, the process control and measurement network may include tens or even hundreds of various explosion proof and intrinsically safe field devices. However, communication between one or more devices within a network may be limited, such as by compromising the timeliness or reliability of the communication of data within the network, particularly as an intrinsically safe device within the network may be limited with respect to energy use. Accordingly, it remains a priority to increase the capability of communication with a device, particularly in hazardous environments commonly associated with devices that include explosion proof enclosures and/or are intrinsically safe.

BRIEF DESCRIPTION OF THE DRAWINGS

For a detailed description of the preferred embodiments of the invention, reference will now be made to the accompanying drawings in which.

DETAILED DESCRIPTION

The following discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed below may be employed separately or in any suitable combination to produce desired results. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but are the same structure or function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. The use of "top," "bottom," "above," "below," and variations of these terms is made for convenience, but does not require any particular orientation of the components.

A Cyclical Redundancy Check, or CRC, is a type of function that is used to detect errors in digital data. In one or more embodiments, a n-bit CRC (e.g., CRC-16, CRC-32, etc.) receives as input a data block represented as a binary value, and divides the binary value by a predetermined n-bit binary or polynomial divisor to generate a remainder that is characteristic of the data block. The remainder may be used as a checksum to determine, for example, if the data block is later altered during transmission or storage. In the art, the term CRC is often used to refer to both the function and its generated remainder; however, for clarity, the present disclosure will refer to the function as the CRC and the remainder as the CRC value.

In the field of data communications, network protocols such as Ethernet, Asynchronous Transfer Mode (ATM), and the like, may employ CRCs to detect transmission errors in messages (i.e., packets or frames) that are sent from one network device to another. For example, in one or more embodiments, a transmitting network device (e.g., router, switch, host network interface, etc.) generates a CRC-32 value for each outgoing packet, and appends the value to the packet prior to transmission. When the packet is received at a receiving network device, the CRC-32 value may be compared to another CRC-32 value, such as one previously received and/or calculated at the receiving network device, such as to verify the integrity of the data contained within the packet and/or verify the integrity of the data and configuration settings of the sending network device or the receiving network device.

Accordingly, disclosed herein are an apparatus, system, and method to communicate and manage communications within a communication network. The network may be wired and/or wireless and/or at least partially positioned or contained within a hazardous area, such as a wellsite. The network may include a master device and one or more slave devices in communication with each other. The method includes determining if a main master CRC value and a main slave CRC value are different. The main master CRC value may be created from a master CRC array, and the master CRC array may be created from master configuration structures. Further, the main slave CRC value may be created from a slave CRC array, and the slave CRC array may be created from slave configuration structures. If the main master CRC value and the main slave CRC value are different, the master CRC array and the slave CRC array may be compared to determine which CRC values from the master and slave CRC arrays are different. Each slave configuration structure, and only such slave configuration structures, associated with each CRC value that is different between the master and slave CRC arrays may then be sent to the master device to replace the corresponding master configuration structures. The main slave CRC value may be received with a real-time data measurement packet from a slave device, and the master configuration structures and/or the slave configuration structures may include data of configuration settings for the slave device. The slave device may include a flow meter, and more particularly may include an embedded flow computer that may take measurements from a flow meter, such as an orifice meter or a turbine flow meter. The real-time data measurement packet may include data of a flow rate and a property measured by the flow meter, and the master configuration structures and/or the slave configuration structures may include data of an internal pipe diameter and mole fraction of material associated with the flow meter.

Figure 1:
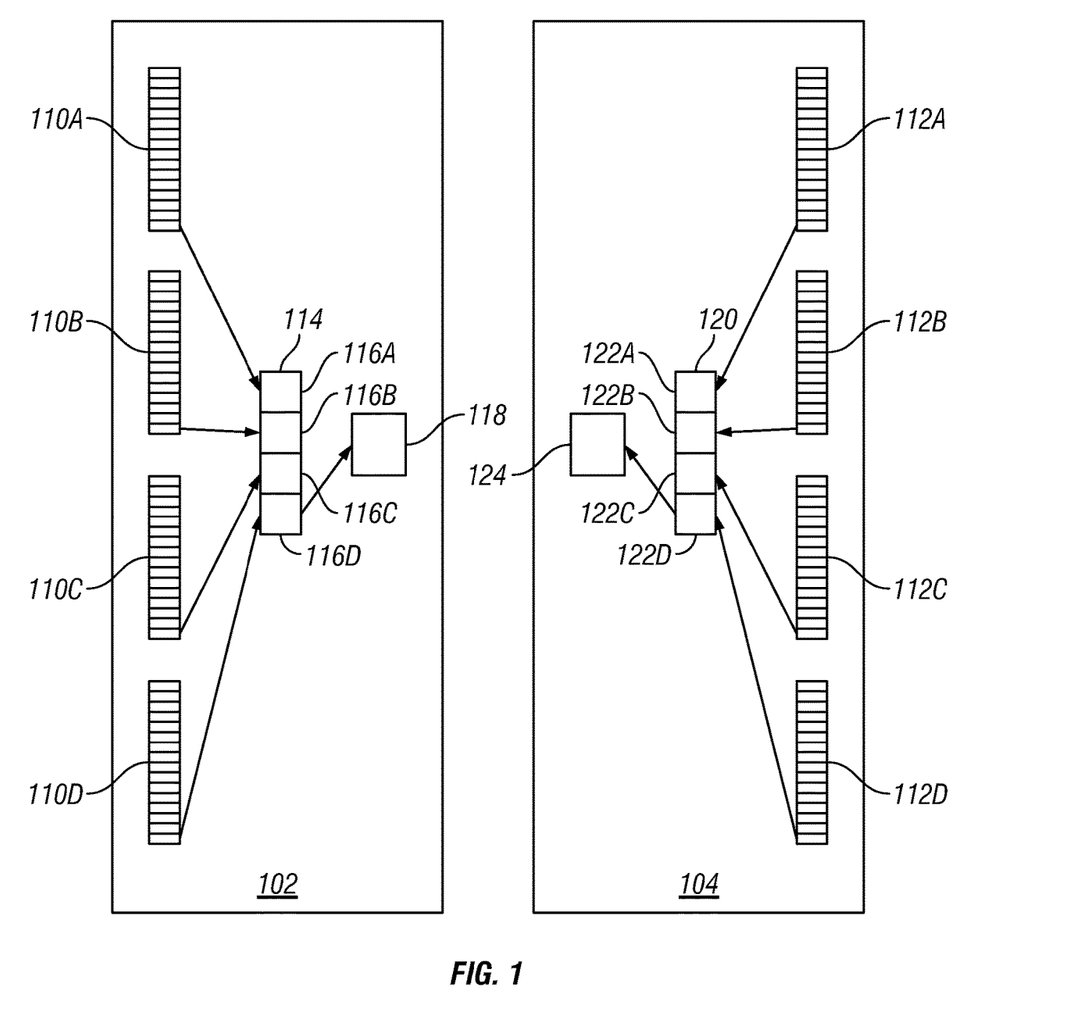
FIG. 1 shows a schematic view of an organization of configurations structures within a master device 102 and a slave device in accordance with one or more embodiments of the present disclosure.

Referring now to FIG. 1, a schematic view of an organization of configurations structures within a master device 102 and a slave device 104 are shown. The master device 102 and the slave device 104 may each include one or more configuration structures in one embodiment, and may each include at least two configuration structures in another embodiment. In FIG. 1, the master device 102 is shown having a first configuration structure 110A, a second configuration structure 110B, a third configuration structure 110C, and a fourth configuration structure 110D. Further, the slave device 104 is shown having a first configuration structure 112A, a second configuration structure 112B, a third configuration structure 112C, and a fourth configuration structure 112D. In one or more embodiments, such as to minimize communication and bandwidth utilization between the master device 102 and the slave device 104, the configuration structures 110A-110D of the master device 102 may be used as duplicates of the configuration structures 112A-112D of the slave device 104.

Accordingly, with respect to FIG. 1, the first configuration structure 110A of the master device 102 may correspond to the first configuration structure 112A of the slave device 104, the second configuration structure 110B of the master device 102 may correspond to the second configuration structure 112B of the slave device 104, the third configuration structure 110C of the master device 102 may correspond to the third configuration structure 112C of the slave device 104, and/or the fourth configuration structure 110D of the master device 102 may correspond to the fourth configuration structure 112D of the slave device 104. Thus, when data, such as measurements, are received at the master device 102 from the slave device 104, the master device 102 may use one or more of the configuration structures 110A-110D when interpreting the data from the slave device 104, as opposed to having the configuration structures 112A-112D also sent with data each time between the master device 102 from the slave device 104. In this embodiment, each of the configuration structures are shown as having 16-bytes, though those having ordinary skill in the art will appreciate that the present disclosure is not so limited and may include more or less bytes.

The master device 102 may be used to create a master CRC array 114 from the master configuration structures 110A-110D. In particular, the master CRC array 114 may include one or more bytes in one embodiment, and may include at least two bytes in another embodiment. The master device 102 may create the master CRC array 114 by applying a CRC function to each of the master configuration structures 110A-110D, thereby creating a CRC value at the master device 102 for each of the configuration structures 110A-110D. The master CRC values for each of the configuration structures 110A-110D may then be stored as a byte within the master CRC array 114. For example, with respect to FIG. 1, a master CRC value for the first configuration structure 110A may be stored within a first byte 116A of the master CRC array 114, a master CRC value for the second configuration structure 110B may be stored within a second byte 116B of the master CRC array 114, a master CRC value for the third configuration structure 110C may be stored within a third byte 116C of the master CRC array 114, and/or a master CRC value for the fourth configuration structure 110D may be stored within a fourth byte 116D of the master CRC array 114. The master device 102 may then create a main master CRC value 118 from the master CRC array 114. For example, the master device 102 may create the main master CRC value 118 by applying a CRC function to the master CRC array 114, thereby creating the main master CRC value 118.

Similarly, the slave device 104 may be used to create a slave CRC array 114 from the slave configuration structures 110A-110D. In particular, the slave CRC array 120 may include one or more bytes in one embodiment, and may include at least two bytes in another embodiment. The slave device 104 may create the slave CRC array 120 by applying a CRC function to each of the slave configuration structures 112A-112D, thereby creating a CRC value at the slave device 104 for each of the configuration structures 112A-112D. The slave CRC values for each of the configuration structures 112A-112D may then be stored as a byte within the slave CRC array 120. For example, with respect to FIG. 1, a slave CRC value for the first configuration structure 112A may be stored within a first byte 122A of the slave CRC array 120, a slave CRC value for the second configuration structure 112B may be stored within a second byte 122B of the slave CRC array 120, a slave CRC value for the third configuration structure 112C may be stored within a third byte 122C of the slave CRC array 120, and/or a slave CRC value for the fourth configuration structure 112D may be stored within a fourth byte 122D of the slave CRC array 120. The slave device 104 may then create a main slave CRC value 124 from the slave CRC array 114. For example, the slave device 104 may create the main slave CRC value 124 by applying a CRC function to the slave CRC array 120, thereby creating the main slave CRC value 124.

Figure 2:
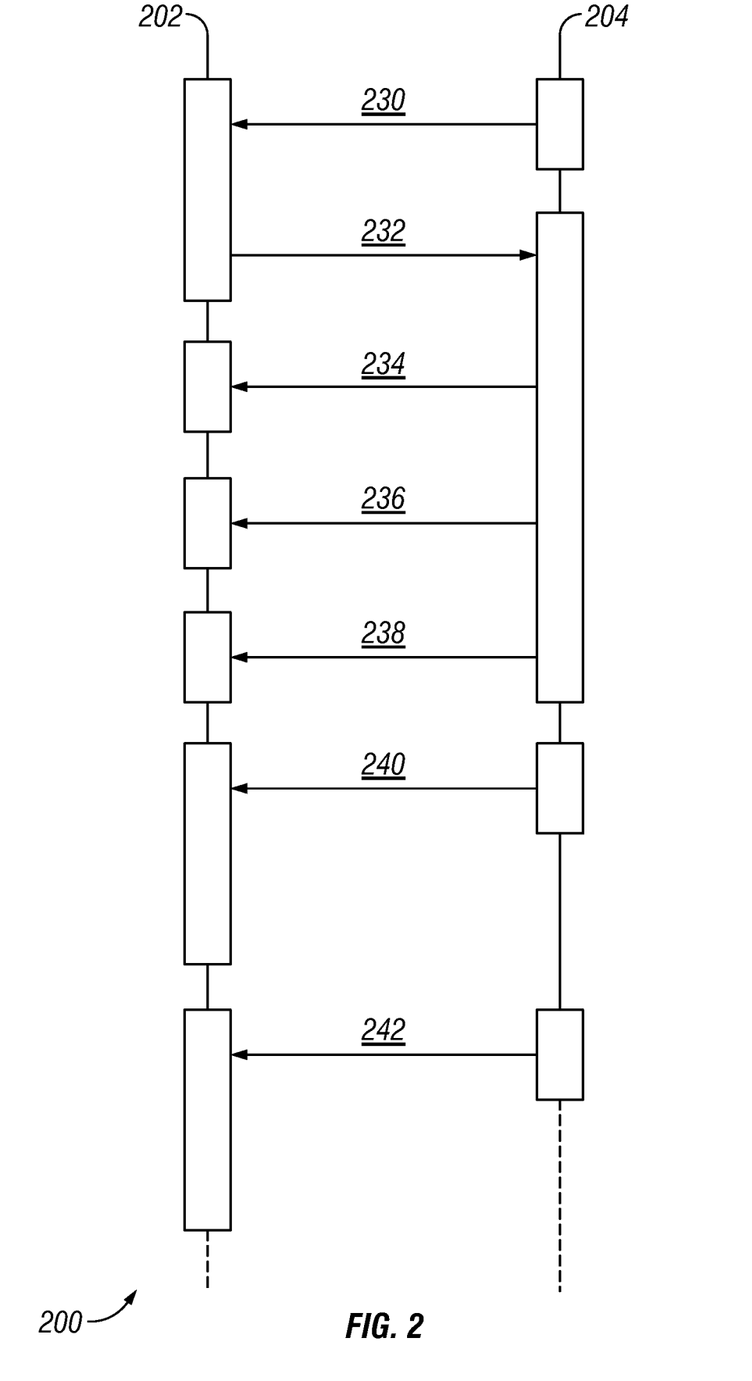
FIG. 2 shows a schematic view of a sequence diagram of an apparatus, a system, and/or a method to manage communications within a network in accordance with one or more embodiments of the present disclosure.

Referring now to FIG. 2, a schematic view of a sequence diagram of an apparatus, a system, and/or a method to communicate and/or manage communications within a network 200 in accordance with one or more embodiments of the present disclosure is shown. The present disclosure may relate particularly to managing communications within a wireless network at least partially positioned or contained within a hazardous area. As shown in FIG. 2, the network 200 may include a master device 202 and one or more slave devices 204 in communication with each other. The master device 202 may have unidirectional control of the slave devices 204, and in one or more embodiments, the master device 202 may be elected amongst a group of two or more devices, with the remaining devices then used as slave devices 204.

As discussed above, a master device and a slave device may be used to create main CRC values, such as from CRC arrays, in which the CRC arrays may be created from configuration structures. Accordingly, in FIG. 2, the slave device 204 may send and the master device 202 may receive a packet 230 that includes the main CRC value from the slave device 204 (e.g., the main slave CRC value 124). The packet 230 may include data recorded by the slave device 204 that may be attributable to a particular location and/or a particular time. In one embodiment, the slave device 204 may include and/or be operably coupled to one or more sensors, such as analog and/or digital sensors. Accordingly, the slave device 204 may include one or more measurements from one or more sensors within the packet 230. Further, in one or more embodiments, the packet 230 may be a real-time data measurement packet, which may include data measured by the slave device 204.

As discussed above, the network 200 may include at least one or more components that are used within a wellsite. As such, a slave device and/or a master device in accordance with one or more embodiments of the present disclosure may include a device to measure one or more properties and/or characteristics of the wellsite, such as a flow meter (e.g., a flow computer, such as an embedded flow computer, connected to or in communication with a flow meter) and/or any other type of measuring device known in the art. In such an embodiment, the slave device may be able to collect one or more measurements related to properties and/or characteristics related to flow through the wellsite. Accordingly, a packet, such as a real-time data measurement packet created by a slave device flow meter may include data of flow rates, such as a volumetric flow rate, a mass flow rate, and/or an energy flow rate, and may include one or more other properties and/or characteristics of the wellsite, such as static pressure, differential pressure, and/or temperature related to the flow rates. The slave device 204 may then create and send packets at predetermined intervals, such as when a predetermined amount of time has passed and/or when a predetermined event has occurred. The configuration structures for the master device 202 and the slave device 204 may include data of configuration settings for the slave device 204. In particular, as the slave device 204 may include a flow meter, the real-time data measurement packet may include data of a flow rate and a property measured by the flow meter, and the master configuration structures and/or the slave configuration structures may include data of an internal pipe diameter and mole fraction of material, such as methane, associated with and/or flowing through the flow meter. As such, the main CRC values of the master device 202 and the slave device 204 may be synchronized to send and compare data and information related to the configurations structures of the master device 202 and the slave device 204.

Continuing with FIG. 2, the main CRC values of the master device 202 and the slave device 204 may be compared with each other to determine if the main CRC values are different. For example, in one embodiment, the master device 202 may compare the main CRC value from the master device 202 (e.g., the main master CRC value 118) with the main CRC value from the slave device 204 (e.g., the main slave CRC value 124) to determine if the main CRC values are different. If the main CRC values are the same, or substantially the same, then this may indicate with a high likelihood that the configuration structures for the master device 202 and the slave device 204 are the same, or substantially the same, in which the master device 202 and the slave device 204 may be determined and synchronized with each other.

If the main CRC values are different, then this may indicate with a high likelihood that the configuration structures for the master device 202 and the slave device 204 are different, or substantially different, in which configuration structures for the master device 202 and the slave device 204 may need to be updated and/or replaced amongst each other. In such an embodiment, such as with respect to FIG. 2, the master device 202 may send and the slave device 204 may receive the CRC array 232 (e.g., the master CRC array 114).

The CRC arrays of the master device 202 and the slave device 204 may be compared with each other to determine which, if any, of the CRC values of the CRC arrays are different. For example, with reference to FIG. 1, the slave device 104 may compare each of the CRC values contained within the bytes 116A-116D of the master CRC array 114 with each of the respective CRC values contained within the bytes 122A-122D of the slave CRC array 120. For the CRC values and bytes of the CRC arrays that are different, the slave structure may then send the configuration structures of the slave device 204 associated with the different CRC values and bytes of the CRC arrays to the master device 202 to update and/or replace the configuration structures of the master device 202. In particular, in one or more embodiments, each slave configuration structure, and only such slave configuration structures, associated with each CRC value that is different between the master and slave CRC arrays may then be sent to the master device 202 to replace the corresponding master configuration structures. For example, with reference to FIG. 1, the master CRC array 114 and the slave CRC array 120 may be compared with each other, in which the slave device 104 and/or the master device 102 may determine that the master CRC value for the first configuration structure 110A stored within the first byte 116A of the master CRC array 114 is different from the slave CRC value for the first configuration structure 112A stored within a first byte 122A of the slave CRC array 120. In such an embodiment in which only the CRC values for the first configuration structures 110A and 112A are determined as different, then the slave device 104 may send and the master device 102 may receive only the first configuration structure 112A of the slave device 104 to update and replace the first configuration structure 110A of the master device 102.

With respect to FIG. 2, the CRC arrays of the master device 202 and the slave device 204 may be compared with each other to determine that three of the CRC values of the CRC arrays are different. As such, the slave device 204 may send and the master device 202 may receive a first slave configuration structure 234 of the slave device 204 to update and replace the corresponding master configuration structure of the master device 202. Further, in such an embodiment, the slave device 204 may send and the master device 202 may receive a second slave configuration structure 236 and a third configuration structure 238 of the slave device 204 to update and replace the corresponding master configuration structures of the master device 202.

After the master device 202 receives one or more configuration structures from the slave device 204 to update and replace one or more configuration structures within the master device 202, the master device 202 may recreate and/or recalculate the master CRC array and/or the main master CRC value. For example, with reference to FIG. 2, after the master device 202 receives the first slave configuration structure 234 to update and replace the corresponding master configuration structure of the master device 202, the master device 202 may recreate the master CRC array using the updated and replaced master configuration structure. The master device 202 may then recreate the main master CRC value from the recreated master CRC array. Alternatively, the master device 202 may wait until receiving the second slave configuration structure 236 and the third configuration structure 238 of the slave device 204 before recreating the master CRC array and the main master CRC value.

Referring still to FIG. 2, the slave device 204 may send and the master device 202 may receive a second packet 240 that includes the main CRC value from the slave device 204. The main CRC values of the master device 202 and the slave device 204 may be compared with each other to determine if the main CRC values are different. In particular, the master device 202 may compare the main CRC value from the master device 202 with the main CRC value from the slave device 204 to determine if the main CRC values are different. In this embodiment, the main CRC values may be the same, or substantially the same, thereby indicating with a high likelihood that the configuration structures for the master device 202 and the slave device 204 are the same, or substantially the same, in which the master device 202 and the slave device 204 may be determined and synchronized with each other. As such, the network 200 may continue with normal operation. Similarly, the slave device 204 may send and the master device 202 may receive a third packet 242 that includes the main CRC value from the slave device 204. Again, in this embodiment, the main CRC values may be compared with each other and determined to have not changed and still be the same, or substantially the same, in which the network 200 may continue with normal operation.

In one or more embodiments, the master device and the slave device may have values associated with and/or predetermined for the master device and the slave device to take certain action, or not take certain action for that matter. For example, in one embodiment, if the master device submits for a particular value or byte of the slave CRC array that all bits are equal to zero (e.g., all 32 bits are equal to zero; 0x00000000), then this value may indicate to the slave device and/or force the slave device to send the corresponding slave configuration structures, independent of the state of equality of the CRC values and elements. In another embodiment, if the master device submits for a particular value or byte of the slave CRC array that all bits are equal to one (e.g., all 32 bits are equal to one; 0xFFFFFFFF), then this value may indicate to the slave device and/or force the slave device to omit the sending of corresponding slave configuration structures, independent of the state of equality of the CRC values and elements. Accordingly, in such embodiments, if the natural state of a slave structure CRC array or a value within the array is equal to zero or one, then the value used within the CRC array may be the CRC result decremented by a predetermined amount, such as decremented by two. This may reserve two codes, such as when the array is equal to zero or one, for the purposes of forced communication and updating between the master device and the slave device.

In one or more embodiments, the master device and/or the slave device have one or more configuration structures edited, in which the edited configuration structure may be used to replace a corresponding configuration structure in the other of the master device and/or the slave device. For example, the slave device may have a configuration setting changed, such as when in use and in the field, thereby editing a slave configuration structure of the slave device. When the slave configuration structure is edited, the slave device may send, such as automatically send, and the master device may receive the edited slave configuration structure. The edited slave configuration structure may then be used to replace and update the corresponding master configuration structure within the master device. For example, with reference to FIG. 1, in an embodiment in which the first configuration structure 112A is updated and edited, the slave device 104 may send and the master device 102 may receive the edited first configuration structure 112A. The edited first configuration structure 112A may then be used by the master device 102 to update and replace the first configuration structure 110A of the master device 102.

After the master device receives one or more edited configuration structures from the slave device to update and replace one or more configuration structures within the master device, the master device may recreate and/or recalculate the master CRC array and/or the main master CRC value. For example, with reference to FIG. 1, after the master device 102 receives the edited first configuration structure 112A to update and replace the corresponding first configuration structure 110A of the master device 202, the master device 102 may recreate the master CRC array 114 using the updated and replaced first configuration structure 110A. The master device 102 may then recreate the main master CRC value 118 from the recreated master CRC array 114.

Similarly, the master device may have a configuration setting changed, thereby editing a master configuration structure of the master device, in which the configuration setting and configuration structure may need to be propagated down to the slave device. When the master configuration structure is edited, the master device may send, such as automatically send, and the slave device may receive the edited master configuration structure. The edited master configuration structure may then be used to replace and update the corresponding slave configuration structure within the slave device. Further, after the slave device receives one or more edited configuration structures from the master device to update and replace one or more configuration structures within the slave device, the slave device may recreate and/or recalculate the slave CRC array and/or the main slave CRC value.

In accordance with one or more embodiments of the present disclosure, the master device and/or the slave device may send one or more packets based upon one or more factors, such as bandwidth available within the network. In one embodiment, the master device, the slave device, and/or another component within the network may measure bandwidth unavailable (e.g., used) and/or bandwidth available (e.g., unused) within the network and determine if enough bandwidth is available for the master device and one or more slave devices to communicate with each other. In particular, the device or component may determine if bandwidth available within the network is above a predetermined amount. If the bandwidth available is above a predetermined amount, the slave device, and/or another component within the network may communicate with each other. For example, if determined that available bandwidth is above a predetermined amount, then the slave device may send and the master device may receive that main slave CRC value, such as accompanied with a packet, to verify synchronization between the master device and the slave device.

Further, in accordance with one or more embodiments of the present disclosure, the master device and/or the slave device may send one or more packets based if a predetermined amount of time has passed or lapsed without communication between the master device and the slave device. For example, the master device, the slave device, and/or another component within the network may be used to determine if a predetermined amount of time has passed, such as a minute, an hour, a day, a week, or some other amount of time, without communication including main CRC values occurring between the master device and the slave device. If such predetermined amount of time has passed, then the master device and/or the slave device may be prompted, such as automatically, to communicate with the other of the master device and the slave device. For example, if a predetermined amount of time has passed without communication including main CRC values occurring between the master device and the slave device, then the master device may send the master CRC array to the slave device to verify synchronization between the master device and the slave device.

Figure 3:
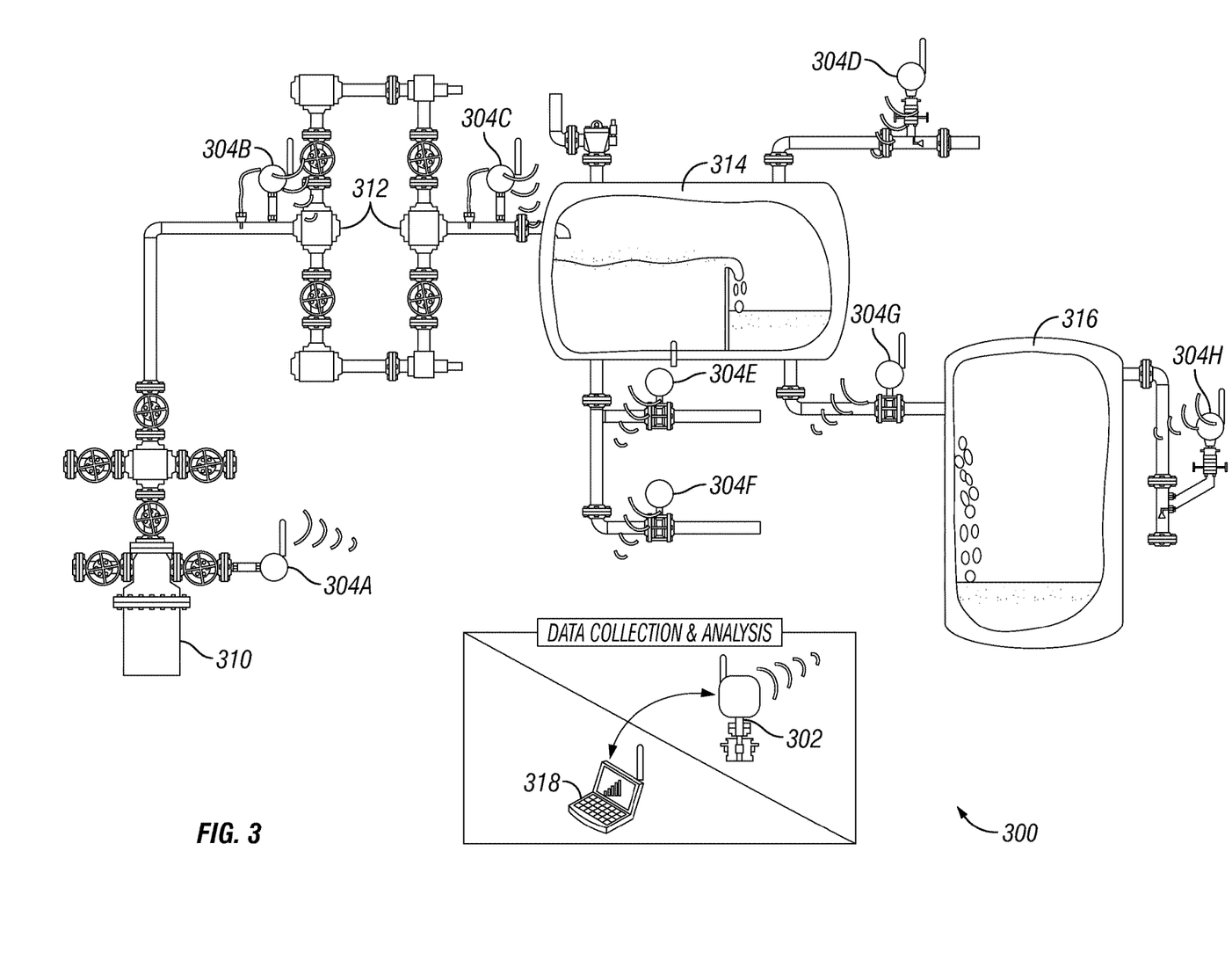
FIG. 3 shows a schematic view of a network in accordance with one or more embodiments of the present disclosure.

Referring now to FIG. 3, a schematic view of a wireless network 300 in accordance with one or more embodiments of the present disclosure is shown. As discussed above, the present disclosure may relate particularly to managing communications within a wireless network at least partially positioned or contained within a hazardous area. Accordingly, one or more components of the wireless network 300 may be included within a hazardous area, such as within a wellsite, as shown.

The wireless network 300 may include a master device 302 with one or more slave devices 304 in communication with the master device 302. As discussed above, the master device 302 and/or one or more of the slave devices 304 may be used as a flow meter and/or any other type of measuring device known in the art to measure one or more properties and/or characteristics of the wellsite. For example, one or more of the slave devices 304 may be able to collect one or more measurements related to properties and/or characteristics related to flow through the wellsite. Accordingly, a packet, such as a real-time data packet, created by one or more of the slave devices 304 may include data of flow rates, such as a volumetric flow rate, a mass flow rate, and/or an energy flow rate. Further, the packet may include one or more other properties and/or characteristics of the wellsite, such as static pressure, differential pressure, and/or temperature related to the flow rates. Furthermore, as discussed above, the packet may include information related to configuration settings of the slave devices 304, such as main CRC values, to verify synchronization of configuration settings between the slave devices 304 and the master device 302.

As such, with respect to FIG. 3, a first slave device 304A may be used to monitor and measure one or more properties and/or characteristics of a wellhead 310, such as to monitor and measure casing pressure. A second slave device 304B may be used to monitor and measure one or more properties and/or characteristics of material flowing into a choke manifold 312. A third slave device 304C may be used to monitor and measure one or more properties and/or characteristics of material flowing out of the choke manifold 312 and/or into a separator 314. A fourth slave device 304D may be used to monitor and measure one or more properties and/or characteristics of material, such as gas, flowing out of the separator 314. A fifth slave device 304E and/or a sixth slave device 304F may be used to monitor and measure one or more properties and/or characteristics of material, such as water, flowing out of the separator 314. A seventh slave device 304G may be used to monitor and measure one or more properties and/or characteristics of material, such as oil, flowing out of the separator 314 and/or into a surge tank 316. Further, an eighth slave device 304H may be used to monitor and measure one or more properties and/or characteristics of material, such as gas, flowing out of the surge tank 316.

The master device 302 may then be in communication with one or more of the slave devices 304. Further, a computer 318 may be in communication with the master device 302, such as to retrieve information with respect to the master device 302 and/or one or more of the slave devices 304. In such an embodiment, the master device 302 may be positioned within the wellsite, whereas the computer 318 may communicate with the master device 302, such as through a Modbus communications protocol, in a non-hazardous area. Further, one or more of the slave devices 304 may be autonomous such that, independent of the connection status between the master device 302 and the slave devices 304, the slave devices 304 may continue to gather information and data and archive records to later be transmitted to the master device 302.

Figure 4:
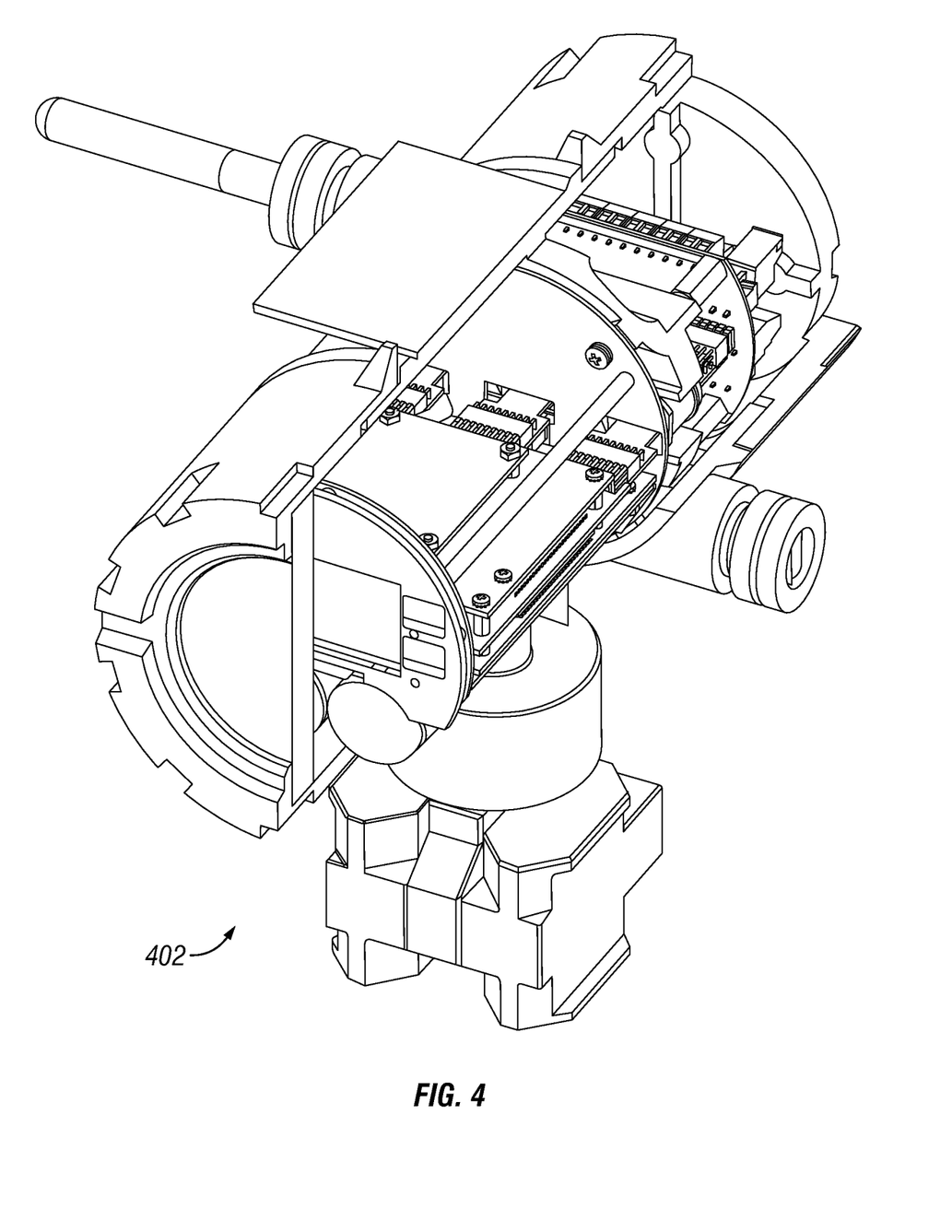
FIG. 4 shows a perspective view of a networked computer system that may be used as a master device in accordance with one or more embodiments of the present disclosure.

Aspects of embodiments disclosed herein, such as sending and receiving information related to configuration settings, creating and storing CRC arrays and main CRC values, and comparing CRC arrays and main CRC values, amongst one or more other functions, may be implemented on a specialized computer for use within a hazardous area and/or any type of computer regardless of the platform being used. For example, as shown in FIG. 4, a networked computer system 402 that may be used as a master device in accordance with an embodiment disclosed herein may include a processor, associated memory, a storage device, and numerous other elements and functionalities typical of today's computers. The networked computer 402 may also include input means, such as a touch screen and/or one or more explosion proof buttons, and output means, such as a display. The networked computer 402 may connected to a local area network (LAN) or a wide area network (e.g., the Internet) via a network interface connection and/or a wireless network connection. Those skilled in the art will appreciate that these input and output means may take many other forms. Additionally, the computer system may not be connected to a network. Further, those skilled in the art will appreciate that one or more elements of aforementioned computer 402 may be located at a remote location and connected to the other elements over a network.

As a network in accordance with the present disclosure may be positioned within a hazardous area, such as within a wellsite, a master device and/or a slave device may be intrinsically safe and/or include an explosion proof enclosure. As such, in accordance with one or more embodiments of the present disclosure, "explosion proof," as used herein, is used in a context consistent with the National Fire Protection Association (NFPA) and the National Electric Code (NEC®), both of which have helped define the term "explosion proof." Definitions for several types of protection techniques acceptable when designing products for use in hazardous (classified) locations include, but are not limited to: explosion proof, dust ignition proof, dust tight, purged/pressurized, intrinsically safe, and hermetically sealed. These definitions set the criteria that must be met by all components installed in hazardous (classified) locations. As such, in accordance with one or more embodiments, to meet the criteria for the explosion proof rating, an enclosure is be able to contain any explosion originating within its housing and to prevent sparks from within its housing from igniting vapors, gases, dust, and/or fibers in the air surrounding it. Therefore, explosion proof, when referring to electrical enclosures, does not mean that it is able to withstand an exterior explosion. Instead, it is the enclosures ability to prevent an internal spark or explosion from causing a much larger blast. Additionally, in one or more embodiments, an explosion proof enclosure is able to meet the temperature requirements of the specific application in which it is to be installed. This means that the operating temperature of the motor (and its enclosure) or other component cannot be greater than the lowest ignition/combustion temperature of the gases or dusts in the atmosphere where the component is to be installed.

An apparatus in accordance with the present disclosure may provide one or more of the following advantages. An apparatus in accordance with the present disclosure may be intrinsically safe such that the apparatus may be used within a hazardous environment. The apparatus as discussed and described above may be limited in the maximum energy stored, power consumption, and/or used with the apparatus to prevent sparking or excessive heat. For example, a communications management system of the present disclosure may be capable of consuming only very low amounts of power for extended periods of time.

Those of skill in the art would understand that information and signals may be represented using any of a variety of different technologies and techniques. For example, data, instructions, commands, information, signals, bits, symbols, communications, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Although the present invention has been described with respect to specific details, it is not intended that such details should be regarded as limitations on the scope of the invention, except to the extent that they are included in the accompanying claims.

What is claimed is:

1. A method to communicate within a communication network comprising physical devices, the physical devices comprising a master device configured to receive collected measurements from a slave device and the slave device configured to collect measurements, the method comprising:
    creating a master Cyclical Redundancy Check ("CRC") array from master configuration structures at the master device;
    creating a main master CRC value from the master CRC array at the master device;
    receiving at the master device a main slave CRC value with a data measurement packet from the slave device, the main slave CRC value created from slave configuration structures used by the slave device to measure data for the data measurement packet;
    determining if the main master CRC value and the main slave CRC value are different at the master device; and
    replacing a master configuration structure at the master device with a slave configuration structure from the slave device if the main master CRC value and the main slave CRC value are different,
    wherein at least one of the master device and the slave device is positioned within a hazardous area, and
    wherein the hazardous area comprises a wellsite.

2. The method of claim 1, further comprising:
    creating a slave CRC array from the slave configuration structures comprising configuration settings for the slave device; and
    creating the main slave CRC value from the slave CRC array.

3. The method of claim 2, further comprising:
    editing one of the slave configuration structures;
    sending the edited slave configuration structure to the master device;
    replacing the master configuration structure with the edited slave configuration structure;
    recreating the slave CRC array from the edited slave configuration structures; and recreating the main slave CRC value from the recreated slave CRC array.

4. The method of claim 1, wherein the replacing the master configuration structure at the master device comprises:
sending the master CRC array to the slave device if the main master CRC value and the main slave CRC value are different;
determining which CRC values from the master CRC array and the slave CRC array are different;
sending only the slave configuration structure associated with each CRC value that is different to the master device; and
replacing the master configuration structure with the slave configuration structure for each CRC value that is different.

5. The method of claim 1, wherein creating the master CRC array comprises:
creating a master CRC value from each master configuration structure; and
creating the master CRC array from the master CRC values.

6. The method of claim 1, wherein the data measurement packet comprises a real-time data measurement packet received from the slave device, and wherein the master configuration structures comprise configuration settings for the slave device.

7. The method of claim 6, wherein the slave device comprises a flow meter, wherein the real-time data measurement packet comprises data of a flow rate and a property measured by the flow meter, and wherein the master configuration structures comprise data of an internal pipe diameter and mole fraction of material associated with the flow meter.

8. The method of claim 1, further comprising:
editing one of the master configuration structures;
recreating the master CRC array from the edited master configuration structures; and
recreating the main master CRC value from the recreated master CRC array.

9. The method of claim 8, further comprising:
sending the edited master configuration structure to the slave device;
replacing a slave configuration structure with the edited master configuration structure;
recreating the slave CRC array from the replaced slave configuration structures; and
recreating the main slave CRC value from the recreated slave CRC array.

10. The method of claim 1, further comprising:
determining if communication with respect to the main slave CRC value has not occurred within the network within a predetermined amount of time;
sending the master CRC array within the network if the predetermined amount of time has lapsed.

11. A non-transitory machine-readable medium for communicating within a communication network comprising physical devices, the physical devices comprising a master device configured to receive collected measurements from a slave device and the slave device configured to collect measurements, the medium comprising code, which, when executed by a machine, causes the machine to perform operations, the operations comprising:
creating a master Cyclical Redundancy Check ("CRC") array from master configuration structures at the master device;
creating a main master CRC value from the master CRC array at the master device;
receiving at the master device a main slave CRC value with a data measurement packet from the slave device, the main slave CRC value created from slave configuration structures used by the slave device to measure data for the data measurement packet;
determining if the main master CRC value and the main slave CRC value are different at the master device; and
replacing a master configuration structure at the master device with a slave configuration structure from the slave device if the main master CRC value and the main slave CRC value are different,
wherein at least one of the master device and the slave device is positioned within a hazardous area, and
wherein the hazardous area comprises a wellsite.

12. The machine-readable medium of claim 11, wherein the operations further comprise:
creating a slave CRC array from the slave configuration structures comprising configuration settings for the slave device;
creating the main slave CRC value from the slave CRC array;
editing one of the slave configuration structures;
sending the edited slave configuration structure to the master device;
replacing the master configuration structure with the edited slave configuration structure;
recreating the slave CRC array from the edited slave configuration structures; and
recreating the main slave CRC value from the recreated slave CRC array.

13. The machine-readable medium of claim 11, wherein the replacing the master configuration structure at the master device operation further comprises:
sending the master CRC array to the slave device if the main master CRC value and the main slave CRC value are different;
determining which CRC values from the master CRC array and the slave CRC array are different;
sending only the slave configuration structure associated with each CRC value that is different to the master device; and
replacing the master configuration structure with the slave configuration structure for each CRC value that is different.

14. The machine-readable medium of claim 11, wherein creating the master CRC array comprises:
creating a master CRC value from each master configuration structure; and
creating the master CRC array from the master CRC values.

15. The machine-readable medium of claim 11, wherein the data measurement packet comprises a real-time data measurement packet received from the slave device, and wherein the master configuration structures comprise configuration settings for the slave device.

16. The machine-readable medium of claim 11, wherein the operations further comprise:
determining if communication with respect to the main slave CRC value has not occurred within the network within a predetermined amount of time;
sending the master CRC array within the network if the predetermined amount of time has lapsed.

17. A method to communicate within a communication network comprising physical devices, the physical devices comprising a master device configured to receive collected measurements from a slave device and the slave device configured to collect measurements, the method comprising:
receiving at the master device a main slave Cyclical Redundancy Check ("CRC") value with a data measurement packet from the slave device, the main slave CRC value created from slave configuration structures used by the slave device to measure data for the data measurement packet;

determining if a main master CRC value and the main slave CRC value are different at the master device;

if the main master CRC value and the main slave CRC value are different, determining which CRC values from a master CRC array and a slave CRC array are different at the master device;

receiving only a slave configuration structure associated with each CRC value that is different at the master device; and replacing a master configuration structure with the slave configuration structure for each CRC value that is different at the master device, wherein at least one of the master device and the slave device is positioned within a hazardous area, and wherein the hazardous area comprises a wellsite.

18. The method of claim 17, further comprising:
creating the master CRC array from master configuration structures;
creating the main master CRC value from the master CRC array;
creating the slave CRC array from the slave configuration structures comprising configuration settings for the slave device; and
creating the main slave CRC value from the slave CRC array.

19. The method of claim 17, wherein:
creating the master CRC array comprises:
 creating a master CRC value from each master configuration structure; and
 creating the master CRC array from the master CRC values;
creating the slave CRC array comprises:
 creating a slave CRC value from each slave configuration structure; and creating the slave CRC array from the slave CRC values.

\* \* \* \* \*